United States Patent [19]

Veranth

[11] Patent Number: 5,033,577

[45] Date of Patent: Jul. 23, 1991

[54] ROOM SOUND REPRODUCING

[75] Inventor: Joseph L. Veranth, Marlborough, Mass.

[73] Assignee: Bose Corporation, Framingham, Mass.

[21] Appl. No.: 280,707

[22] Filed: Dec. 6, 1988

[51] Int. Cl.[5] .................. H05K 5/00

[52] U.S. Cl. .................. 181/145; 181/156

[58] Field of Search .................. 181/144, 145, 148, 156, 181/163, 199; 381/24, 79, 82, 87-90, 19, 77, 80

[56] References Cited

U.S. PATENT DOCUMENTS

| | | | |
|---|---|---|---|
| 2,210,477 | 8/1940 | Benecke et al. | 181/150 |
| 4,146,744 | 3/1979 | Veranth | 181/156 X |
| 4,199,657 | 4/1980 | Lane | 181/145 X |
| 4,356,881 | 11/1982 | Lowell | 181/150 |
| 4,398,619 | 8/1983 | Daniel | 181/156 |
| 4,452,333 | 6/1984 | Peavey et al. | 181/144 |
| 4,482,026 | 11/1984 | Stehlin, Jr. | 181/156 X |
| 4,549,631 | 10/1985 | Bose | 181/155 |
| 4,875,546 | 10/1989 | Krnan | 181/148 X |

FOREIGN PATENT DOCUMENTS

| | | | |
|---|---|---|---|
| 2327697 | 5/1977 | France | 181/163 |

*Primary Examiner*—Brian W. Brown
*Attorney, Agent, or Firm*—Fish & Richardson

[57] ABSTRACT

Stereo electroacoustical transducing apparatus for providing acoustical reproduction in a room at least partially bounded by a room bounding surface including a floor, sidewalls, and a ceiling, the apparatus including a nonlocalizable woofer module that is mounted outside of the room and communicates with an opening in the room bounding surface, upper frequency drivers located within the room, and electronics for providing audio electrical signals to the nonlocalizable woofer module and the upper frequency drivers.

17 Claims, 2 Drawing Sheets

ROOM SOUND REPRODUCING

BACKGROUND OF THE INVENTION

The present invention relates in general to electro-acoustical transducing and more particularly concerns an improved system for providing acoustical reproduction in a room.

A prior art room speaker system, available from Bose Corporation under the AM-5 trade designation, is described in Hirsch, J., "Bose AM-5 Speaker System," *Stereo Review* (April 1987) ("Hirsch"), which is hereby incorporated by reference. The AM-5 system includes a ported woofer module that is nonlocalizable; i.e., the location of the woofer module cannot be determined by listening. The woofer module enclosure is in the shape of a box with two openings and is usually located on the floor near a wall. The structure and operation of the nonlocalizable ported woofer used in the AM-5 speaker system is described in U.S. Pat. No. 4,549,631, which is hereby incorporated by reference.

SUMMARY OF THE INVENTION

In general, the invention features an improved system for providing acoustical reproduction in a room using a nonlocalizable woofer module that is mounted outside of the room and communicates with an opening in a surface bounding the room (i.e., a sidewall, a floor, or a ceiling) and upper frequency drivers that are located within the room. The relatively bulky woofer module thus need not take up space within the room, and the nonlocalizable nature of the woofer module provides good low-frequency sound throughout the room.

In a preferred embodiment, the woofer module has an enclosure with a baffle that carries a woofer driver and divides the interior into first and second subchambers; the subchambers are ported to an end chamber in the enclosure, and the end chamber communicates with the opening in the room bounding surface. In another embodiment, the nonlocalizable woofer module includes acoustic wave guides.

Other advantages and features of the invention will be apparent from the following description of a preferred embodiment thereof and from the claims.

DESCRIPTION OF THE PREFERRED EMBODIMENT

The preferred embodiment will now be described.

Drawings

Structure

Figure 1:
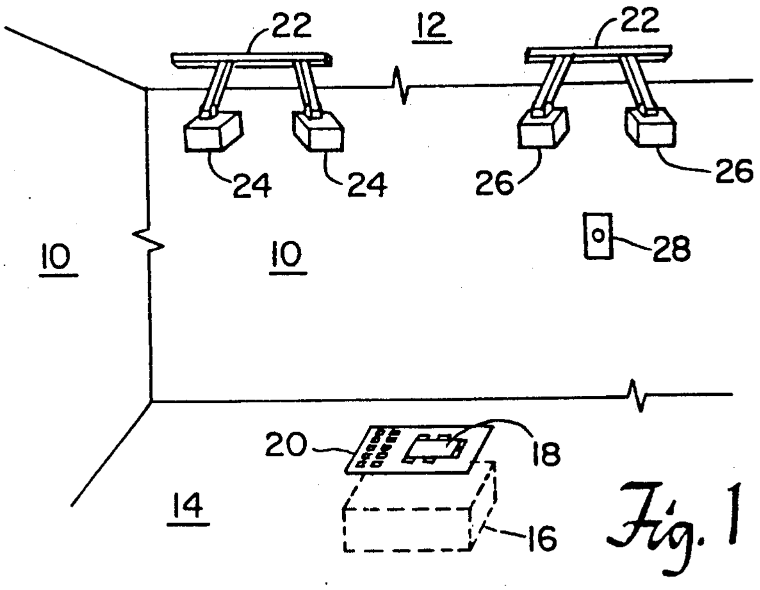
FIG. 1 is a diagrammatic, perspective view of a room including a speaker system according to the invention.

Referring to FIG. 1, sidewalls 10, ceiling 12 and floor 14 of a room are shown. Mounted underneath floor 14 is nonlocalizable woofer module 16. It is ported to opening 18 in floor 14 under grill 20. Mounted on tracks 22 on ceiling are left speaker cubes 24 and right speaker cubes 26. Speaker cubes 24, 26 are identical, each cube of a pair aiming in a different direction. Each speaker cube 24, 26 is approximately four inches along each side, has a 3-inch driver, and has a frequency response of 200 Hz to 18 kHz, ± 6 dB. Speaker cubes 24, 26 thus provide upper frequency drivers. Nonlocalizable woofer module 16 is about 23 inches by 12 inches by 7 inches, includes two 6-inch low-frequency drivers, and has a frequency response of 40 Hz to 180 Hz, ± 6 dB. Nonlocalizable woofer module 16 is described in detail in U.S. Pat. No. 4,549,631 ("'631 patent"). Opening 18 in floor 14 is about 6 inches from the sidewall 10 behind it and on the same side of the room as speaker cubes 24, 26. Opening 18 is located at least eight feet from the main listening area in the room. Volume control switch 28 is mounted on a sidewall 10.

Figure 2:
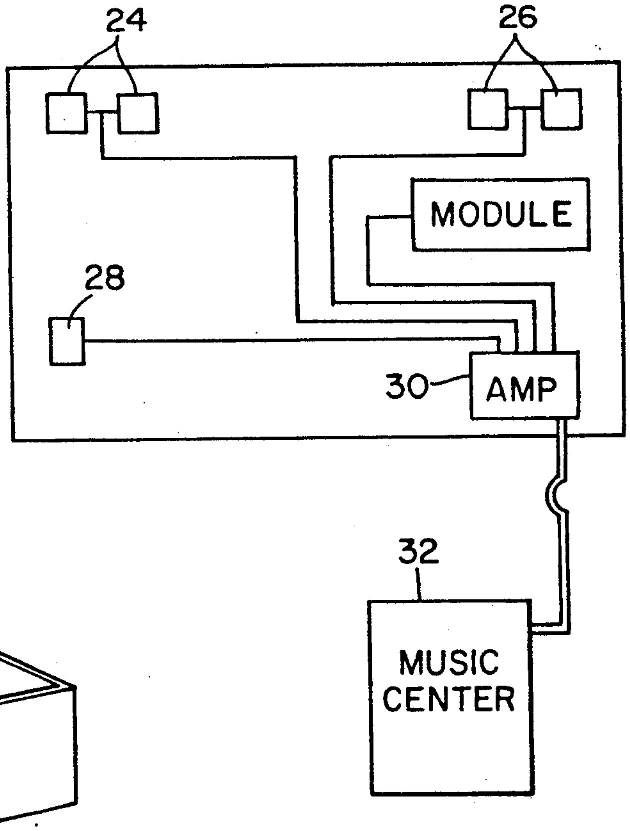
FIG. 2 is a block diagram of the FIG. 1 room speaker system and associated electronics.

Referring to FIG. 2, nonlocalizable woofer module 16 and speaker cubes 24, 26 are provided with audio electrical signals by amplifier 30. Wall mounted volume control switch 28 is also connected to amplifier 30, which in turn receives audio electrical signals from music center 32, which includes, for example, a tuner and a cassette player.

Figure 3:
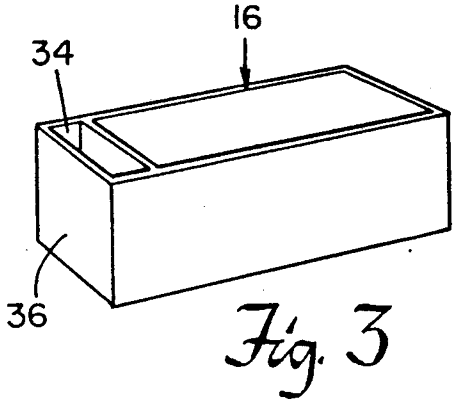
FIG. 3 is a perspective view of a woofer module used in the FIG. 1 speaker system.
Figure 4:
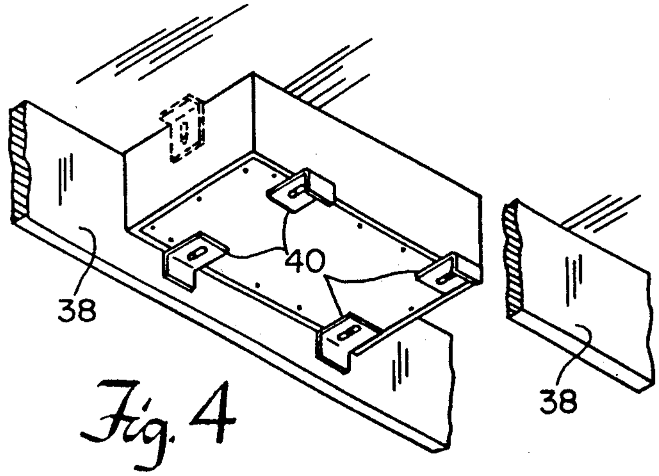
FIG. 4 is a perspective view, partially broken away, showing mounting of the FIG. 3 woofer module under the floor of a room.
Figure 5A:
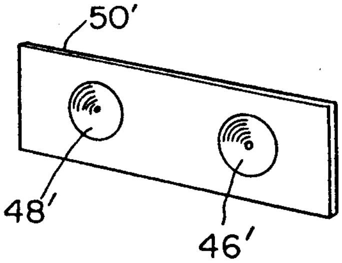
FIG. 5A illustrates a modification of the embodiment of FIG. 5 using drone cones.
Figure 5:
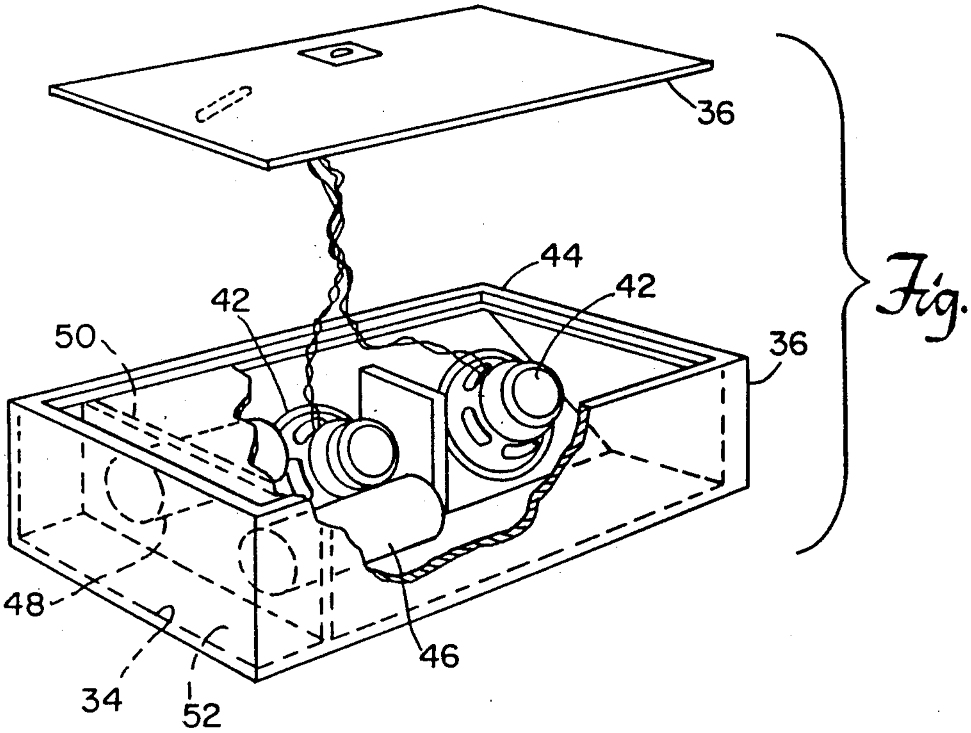
FIG. 5 is a perspective view, partially broken away and exploded, of the FIG. 4 woofer module.

Referring to FIGS. 3-5, nonlocalizable woofer module 16 has a slotted opening 34 at one end of its box-shaped enclosure 36. Enclosure 36 is mounted between adjacent joists 38 underneath floor 14 via brackets 40. Six-inch low frequency drivers 42 are mounted within enclosure 36 on inclined baffle 44, which divides a woofer region within enclosure 36 into two subchambers. Each subchamber is ported via a respective port tube 46, 48 through wall 50 to end chamber 52, communicating with slotted opening 34. By having end chamber 52 at the end of enclosure 36 and slotted opening 34 in one of the two sides of enclosure 36 that have the largest area, enclosure 36 can be mounted with its smallest dimension extending downward from floor 14, to facilitate mounting and avoid taking up space.

Nonlocalizable woofer module 16 could be mounted to be ported to openings in other room bounding surfaces, e.g., sidewalls 10 or ceiling 12. Opening 18 is preferably near a boundary of two such surfaces, for example, in ceiling 12 near a sidewall 10, or in a sidewall 10 near ceiling 12 or floor 14, but is preferably spaced from a corner of a room, to avoid undesirable bass boost with this embodiment. Opening 18 is preferably located at least eight feet from the main listening area for better balance of sound from cube speakers 24, 26 and woofer module 16. Generally, nonlocalizable woofer module 16 is preferably located at the same end of the room as cube speakers 24, 26; however, because the bass provided by nonlocalizable woofer module 16 is nonlocalizable, it may be located elsewhere. If nonlocalizable woofer module 16 is mounted at the opposite end of the room from cube speakers 24, 26, it is preferably placed further away from the listener than cube speakers 24, 26. Opening 18 is preferably located within six inches of one of the walls, for improved bass response. Opening 18 is preferably adjacent to or in a sidewall 10 that is an outside wall of the building to reduce the chance of bass sound being heard in the other rooms.

Operation

In operation, speaker cubes 24, 26 provide the mid and high frequencies, and nonlocalizable woofer module 16 provides the low frequencies. Nonlocalizable woofer module 16 operates as described in the '631 patent and Hirsch article, except that end chamber 52 and associated slotted opening 34 divert sound energy from port tubes 46, 48 to opening 18. Port tubes 46, 48 comprise acoustic masses that resonate with the compliance of the air in the respective subchambers to establish a cutoff frequency sufficiently low so that the low frequencies provided by nonlocalizable woofer module 16 are nonlocalizable. Listeners thus cannot easily identify the location of the woofer module, and the relatively bulky woofer module enclosure need not be located within the room.

Other Embodiments

Figure 6:
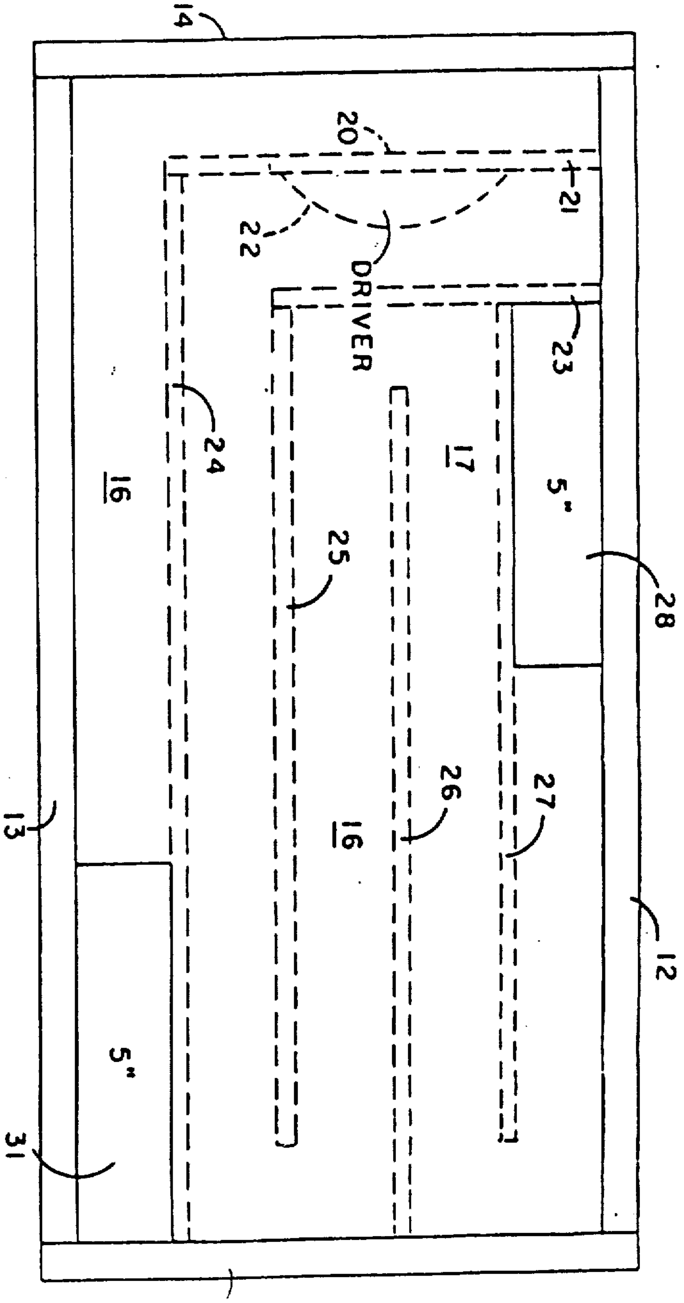
FIG. 6 is a plan view of an embodiment of the invention using an acoustic waveguide.

Other embodiments of the invention are within the scope of the following claims. E.g., nonlocalizable woofer module 16 could employ other passive radiators (e.g., drone cones 46' and 48' mounted on wall 50' as shown in FIG. 5A) in place of port tubes 46, 48 and could be of a type that an acoustic wave guide, as described in U.S. Pat. No. 4,282,605, which is hereby incorporated by reference as shown in FIG. 6, which is a reproduction of FIG. 1 of the latter patent. Nonlocalizable woofer module 16 could also be design other technology that gives it acoustic low pass filtering such as to render it nonlocalizable. Nonlocalizable woofer module 16 could also be designed for optimum operation spaced from a sidewall or near a corner of a room.

What is claimed is:

1. Electroacoustical transducing apparatus for providing acoustical reproduction in a room at least partially bounded by a room bounding surface including a floor, sidewalls, and a ceiling, said apparatus comprising a nonlocalizable woofer module that is mounted in a location outside of said room and communicates with an opening in said room bounding surface, said nonlocalizable woofer module characterized by a cutoff frequency sufficiently low so that the low frequency spectral components provides by said nonlocalizable woofer module into said room are nonlocalizable, whereby listeners cannot easily identify the location of said woofer module, said nonlocalizable woofer module having an enclosure outside said room including an interior and at least one acoustic mass with a baffle dividing said interior into said first and second subchambers characterized by acoustic compliance and a woofer driver on said baffle with the woofer driver coupled to said room through at least one conduit characterized by acoustic mass that is coupled to said opening and coacts with at least said acoustic compliance to establish said cutoff frequency, upper frequency drivers located within said room, and means for providing audio electrical signals to said nonlocalizable woofer module and said upper frequency drivers.

2. The apparatus of claim 1 wherein said woofer module has a wall further dividing the interior of said enclosure into an end chamber communicating with said opening and a woofer region that includes said first and second subchambers.

3. The apparatus of claim 2 wherein said enclosure has a plurality of sides having different areas at least one side of which has the largest area of said different areas, and said opening is in a side having the largest area.

4. The apparatus of claim 2 wherein said woofer module includes first and second passive radiators each characterized by acoustic mass for coupling said first and second subchambers respectively to said end chamber.

5. The apparatus of claim 4 wherein said passive radiators comprise port tubes.

6. The apparatus of claim 4 wherein said passive radiators comprise drone cones.

7. The apparatus of claim 1 wherein said woofer module is mounted at the same side of said room as said upper frequency drivers.

8. The apparatus of claim 1 wherein said opening is located close to an intersection of said floor with said sidewall or to an intersection of said ceiling with a said sidewall.

9. The apparatus of claim 1 wherein said opening is located within six inches of said intersection.

10. The apparatus of claim 1 wherein said nonlocalizable woofer module has acoustic wave guides within an enclosure.

11. Electroacoustical transducer apparatus for providing acoustical reproduction in a room at least partially bounded by a room bounding surface including a floor, sidewalls, and a ceiling, said apparatus comprising, an enclosure having an interior, a nonlocalizable woofer module including said enclosure that is mounted in a location outside of said room and communicates with an opening in said room bounding surface, said nonlocalizable woofer module characterized by a cutoff frequency sufficiently low so that the low frequency spectral components provided by said nonlocalizable woofer module into said room are nonlocalizable, whereby listeners cannot easily identify the location of said woofer module, upper frequency drivers located within said room, and means for providing audio electrical signals to said nonlocalizable woofer module and said upper frequency drivers, said baffle carrying a woofer driver, wherein said woofer module has a wall dividing the interior of said enclosure into an end chamber communicating with said opening and a woofer region that includes first and second subchambers, wherein said woofer module includes first and second passive radiators each characterized by acoustic mass for coupling said first and second subchambers respectively to said end chamber.

12. The apparatus of claim 11 wherein said passive radiators comprise port tubes.

13. The apparatus of claim 11 wherein said passive radiators comprise drone cones.

14. A nonlocalizable woofer module comprising an enclosure having an interior inside a plurality of sides defining said enclosure and an opening in one of said sides near an end of said one of said sides, a wall dividing the interior of said enclosure into an end chamber communicating with said opening and a woofer region having an interior, a baffle dividing the interior of said woofer region into first and second subchambers, a woofer driver carried by said baffle, and first and second passive radiators each characterized by acoustic mass coupling said first and second subchambers to said end chamber.

15. The module of claim 14 wherein at least some of said sides have different areas and said one of said sides has the largest area of said different areas.

16. The apparatus of claim 14 wherein said passive radiators comprise port tubes.

17. The apparatus of claim 14 wherein said passive radiators comprise drone cones.

* * * * *

UNITED STATES PATENT AND TRADEMARK OFFICE

CERTIFICATE OF CORRECTION

PATENT NO. : 5,033,577

DATED : July 23, 1991

INVENTOR(S) : Joseph L. Veranth

It is certified that error appears in the above-identified patent and that said Letters Patent is hereby corrected as shown below:

Cover page, "2 Drawings Sheets" should read --3 Drawing Sheets--.

At the top of Sheet 1, "Sheet 1 of 2" should read --Sheet 1 of 3--.

At the top of Sheet 2, "Sheet 2 of 2" should read --Sheet 2 of 3--.

Sheet 3 bearing FIG. 6 should be added as per attached sheet.

Column 3, line 29, "design" should read --designed by--.

Column 4, line 26, "transducer" should read --transducing--.

Signed and Sealed this

Twenty-seventh Day of April, 1993

*Attest:*

MICHAEL K. KIRK

*Attesting Officer*

*Acting Commissioner of Patents and Trademarks*

United States Patent [19]

Veranth

[11] Patent Number: 5,033,577

[45] Date of Patent: Jul. 23, 1991

[54] ROOM SOUND REPRODUCING

[75] Inventor: Joseph L. Veranth, Marlborough, Mass.

[73] Assignee: Bose Corporation, Framingham, Mass.

[21] Appl. No.: 280,707

[22] Filed: Dec. 6, 1988

[51] Int. Cl.[5] .............................................. H05K 5/00

[52] U.S. Cl. .................................... 181/145; 181/156

[58] Field of Search ............... 181/144, 145, 148, 156, 181/163, 199; 381/24, 79, 82, 87-90, 19, 77, 80

[56] References Cited

U.S. PATENT DOCUMENTS

| | | | |
|---|---|---|---|
| 2,210,477 | 8/1940 | Benecke et al. | 181/150 |
| 4,146,744 | 3/1979 | Veranth | 181/156 X |
| 4,199,657 | 4/1980 | Lane | 181/145 X |
| 4,356,881 | 11/1982 | Lowell | 181/150 |
| 4,398,619 | 8/1983 | Daniel | 181/156 |
| 4,452,333 | 6/1984 | Peavey et al. | 181/144 |
| 4,482,026 | 11/1984 | Stehlin, Jr. | 181/156 X |
| 4,549,631 | 10/1985 | Bose | 181/155 |
| 4,875,546 | 10/1989 | Krnan | 181/148 X |

FOREIGN PATENT DOCUMENTS

| | | | |
|---|---|---|---|
| 2327697 | 5/1977 | France | 181/163 |

*Primary Examiner*—Brian W. Brown

*Attorney, Agent, or Firm*—Fish & Richardson

[57] ABSTRACT

Stereo electroacoustical transducing apparatus for providing acoustical reproduction in a room at least partially bounded by a room bounding surface including a floor, sidewalls, and a ceiling, the apparatus including a nonlocalizable woofer module that is mounted outside of the room and communicates with an opening in the room bounding surface, upper frequency drivers located within the room, and electronics for providing audio electrical signals to the nonlocalizable woofer module and the upper frequency drivers.

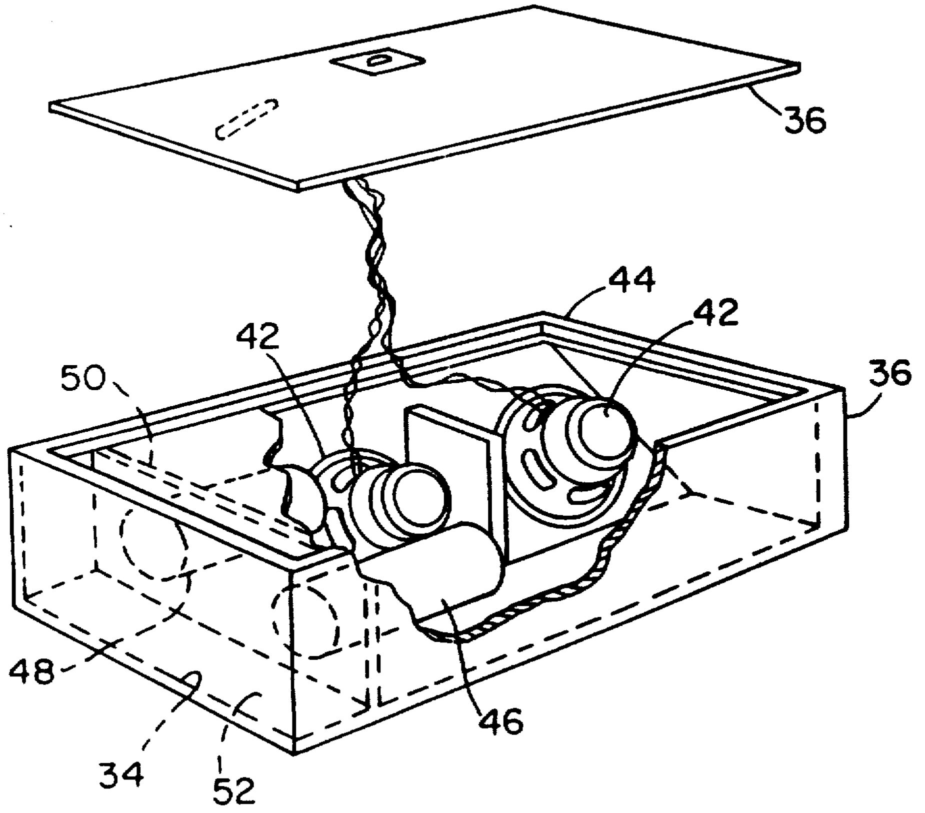

17 Claims, 3 Drawing Sheets